United States Patent [19]

Grabbe

[11] Patent Number: 5,173,055
[45] Date of Patent: Dec. 22, 1992

[54] AREA ARRAY CONNECTOR

[75] Inventor: Dimitry G. Grabbe, Middletown, Pa.

[73] Assignee: AMP Incorporated, Harrisburg, Pa.

[21] Appl. No.: 742,771

[22] Filed: Aug. 8, 1991

[51] Int. Cl.$^5$ .............................................. H01R 9/09
[52] U.S. Cl. ........................................ 439/66; 439/81;
439/83; 439/591; 439/885
[58] Field of Search ...................... 439/65, 66, 78, 81,
439/83, 591, 885, 886

[56] References Cited

U.S. PATENT DOCUMENTS

| | | | |
|---|---|---|---|
| 4,026,627 | 5/1977 | Benasutti | 439/886 |
| 5,015,191 | 5/1991 | Grabbe et al. | 439/71 |
| 5,061,192 | 10/1991 | Chapin et al. | 439/66 |

*Primary Examiner*—Paula A. Bradley
*Attorney, Agent, or Firm*—Alan B. Osborne; Bruce J. Wolstoncroft

[57] ABSTRACT

An area array connector (32,42,50) for electrically interconnecting two electronic devices is disclosed. The connector (32,42,50) includes a plurality of contact elements (10) having parallel cantilevered contact fingers (18) extending obliquely outwardly from a plate (20) for one embodiment, a laminate (32) is formed by securing the contact elements (10) to a dielectric (26) having windows (28) through which the fingers (18) extend. The laminate (32) can then be fixed to a device such as a circuit board (40) to form another form of a connector (42) and further, the dielectric (26) can be removed to form yet another form of connector (50).

10 Claims, 8 Drawing Sheets

AREA ARRAY CONNECTOR

FIELD OF THE INVENTION

The invention disclosed herein relates to high density connectors for providing a separable interconnection between electronic devices such as multichip modules and circuits on a circuit board.

BACKGROUND OF THE INVENTION

There are circumstances when very large multichip modules must be separably interconnected to circuits on a circuit board. In some cases, when the number of contacts is large, the combined normal force of the contacts can require up to 150 pounds per square inch. This is a result of each contact having a normal force of 120–150 grams. In some cases, the substrate of the multichip module cannot support such loading without deforming. Since the chips are mounted on the opposite side of the substrate, the strain on the chips, due to the induced curvature of the deformed substrate, may be sufficient enough to damage them or their bonds. Accordingly, it is now proposed to provide an area array connector having a very low normal force of 50 grams per contact or less.

SUMMARY OF THE INVENTION

According to the present invention, an electrical area array connector for interconnecting electronic devices is provided wherein a plurality of contact elements each have one or more a cantilevered contact fingers extending obliquely outwardly from one side of a plate with the contacts electrically and mechanically attached to contact pads of one of the devices.

DESCRIPTION OF THE INVENTION

Figure 1:
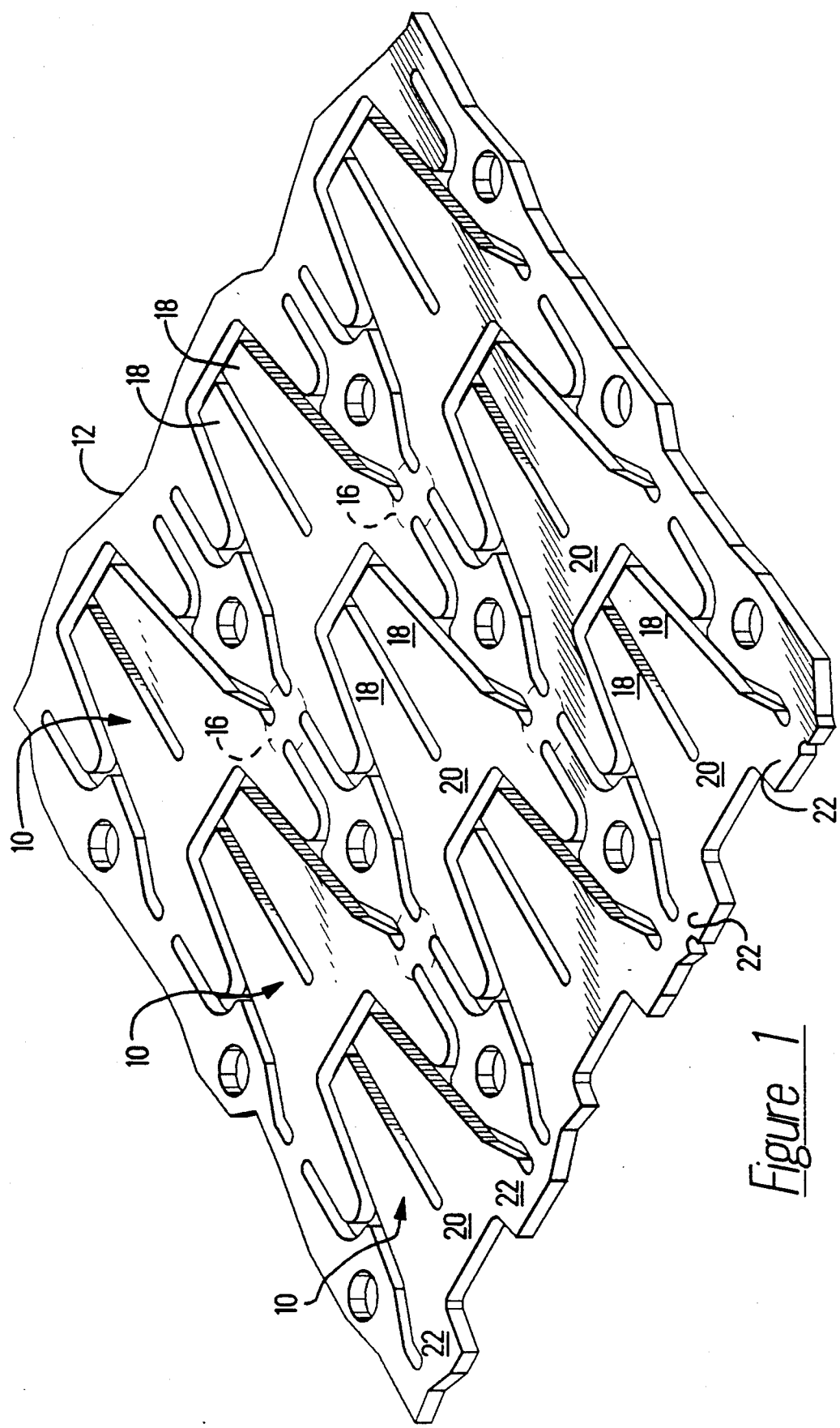
FIG. 1 is a view showing a sheet of several stamped or etched contact elements of the present invention.
Figure 10:
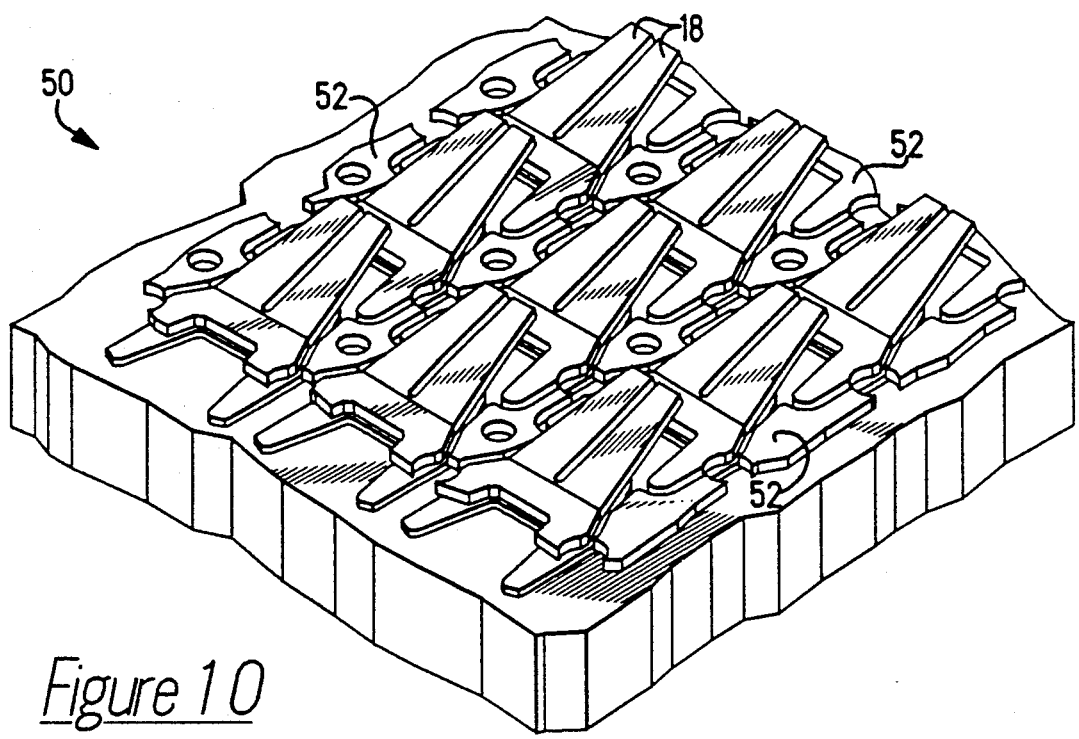
FIG. 10 is a view of an alternative embodiment of an assembly with the laminate film removed and with temporary structural members remaining.

FIG. 1 shows a number of contact elements 10 in sheet 12. Elements 10 are cut out and temporarily connected together by the sheet material within dashed circles 16. Separated elements 10 are shown in FIG. 10. The process for cutting elements 10 include but is not limited to laser cutting, WEDM, stamping or chemical milling.

In the embodiment shown, each contact element 10 includes a pair of parallel cantilevered beams or resilient contact fingers 18 extending outwardly from one side or edge of plate 20 and a pair of legs 22 extending outwardly from an opposite side or edge and at opposite ends thereof.

Sheet 12 is shown to have nine contact elements 10 therein. This is only for illustrational purposes since the number is a function of the desired size of elements 10 and size of sheet 12. For example sheet 12 may be a continuous roll of metal with a pre-determined width being fed through stamping machine and re-rolled for further processing at another location.

Figure 2:
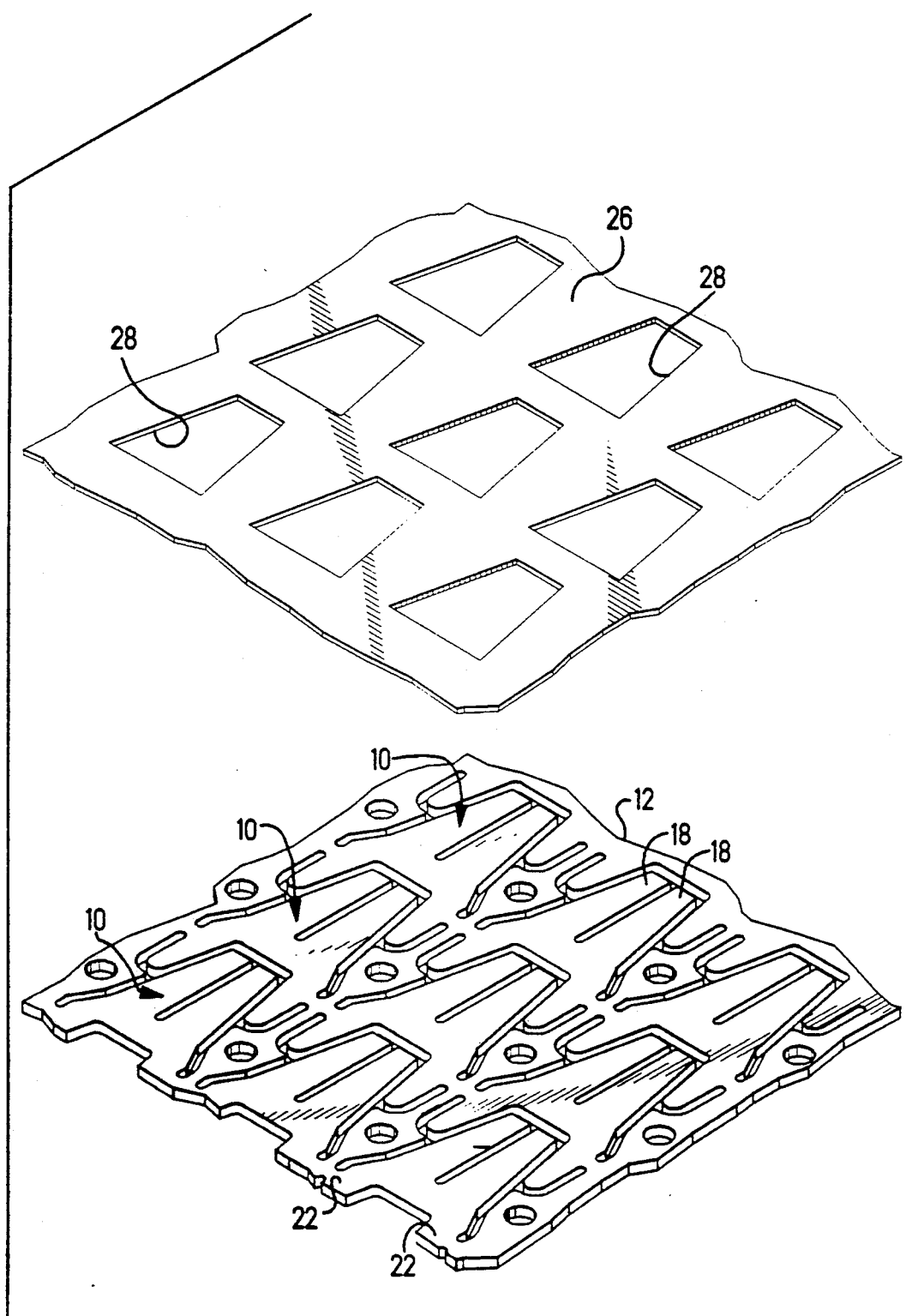
FIG. 2 is a view showing the sheet of contact elements and a sheet of film.

FIG. 2 shows a sheet 12 with film 26 spaced above it. Windows 28 have been cut in film 26 on the same spacing as contact fingers 18 on sheet 12. Film 26 can be of any suitable insulating material such as, for example, kapton, polyester, mylar and so forth.

Figure 3:
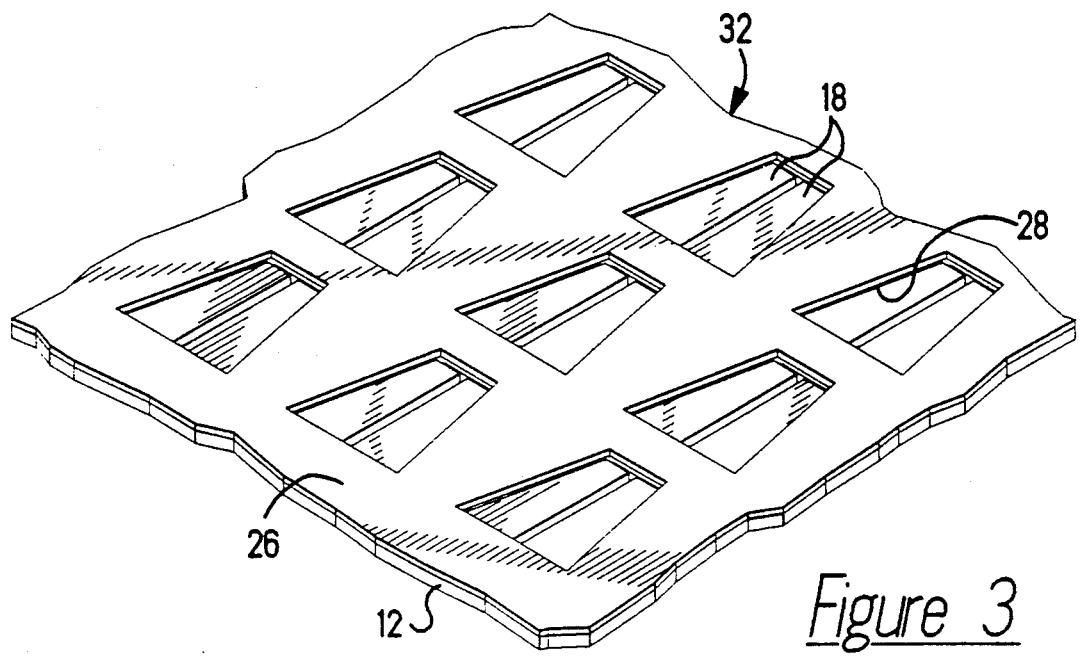
FIG. 3 is a view of the sheets of contact elements and film laminated together forming a contact laminate.

FIG. 3 shows a contact laminate 32 formed by attaching film 26 to sheet 12 with openings or windows 28 in registration with contact fingers 18. The lamination can be by means of an adhesive which could be either solvent soluble or not.

Figure 4:
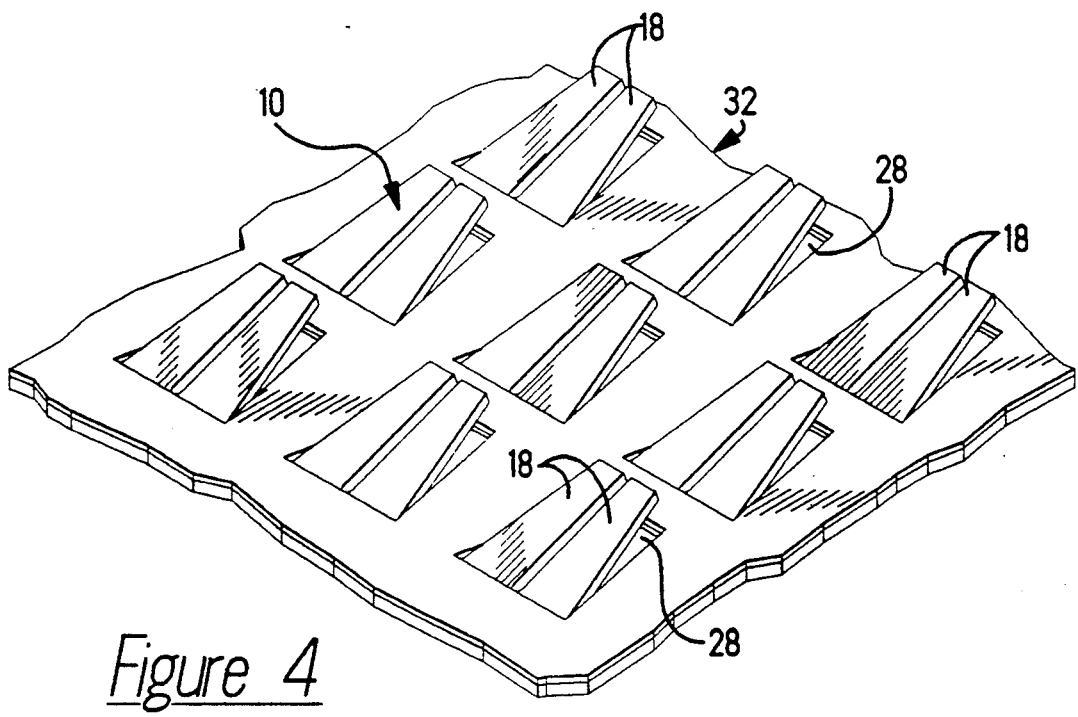
FIG. 4 shows the contact laminate with the contact fingers formed obliquely upwardly.

As shown in FIG. 4, the next step is to form contact fingers 18 to extend obliquely through windows 28 and above the plane of film 26. However, fingers 18 can be formed up prior to lamination. Plate 20 and legs 22 remain flat.

Figure 5:
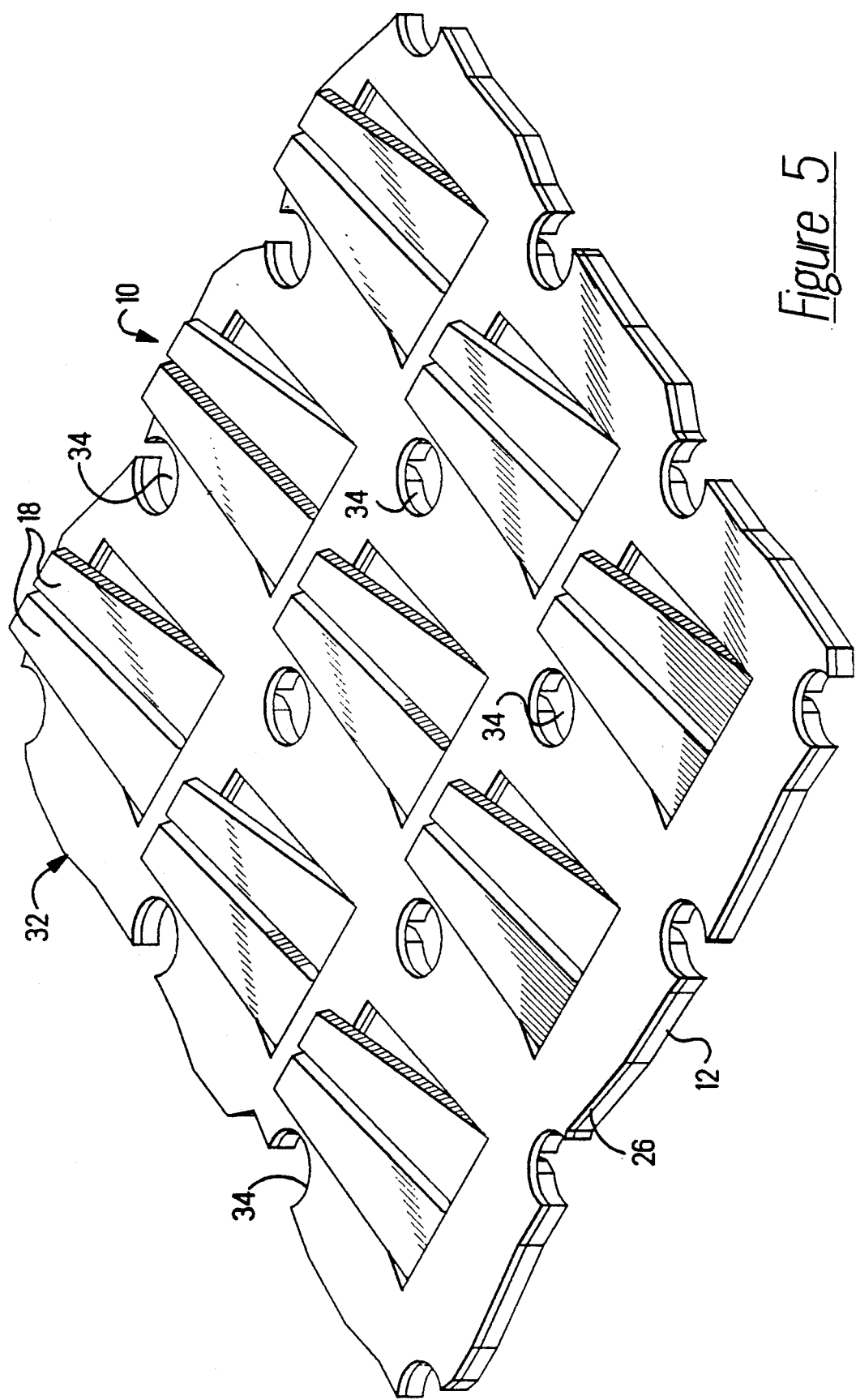
FIG. 5 is a view of the contact laminate after being perforated to separate the several contact elements.

Contact elements 10 are next separated from each other by cutting the temporary connections within the dashed circles 16 shown in FIG. 1. FIG. 5 shows perforations 34 through laminate 32 which sever the connections. The perforating may be done by for example punching, drilling, laser cutting or chemical milling.

Laminate 32, as shown in FIG. 5 can be used as an interconnect connector if desired.

Figure 6:
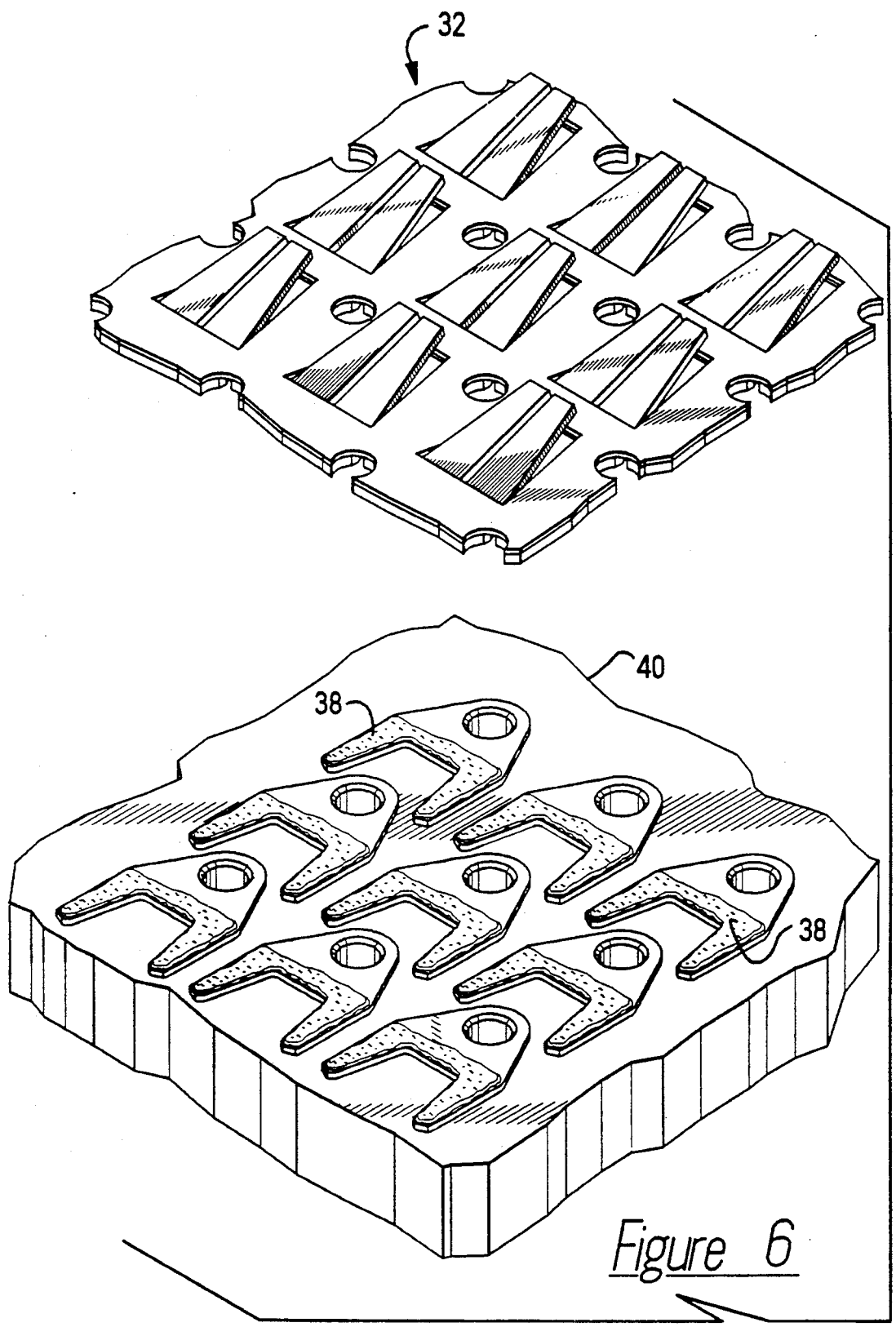
FIG. 6 is a view of a printed circuit board with selected solder areas and the contact laminate thereabove.
Figure 7:
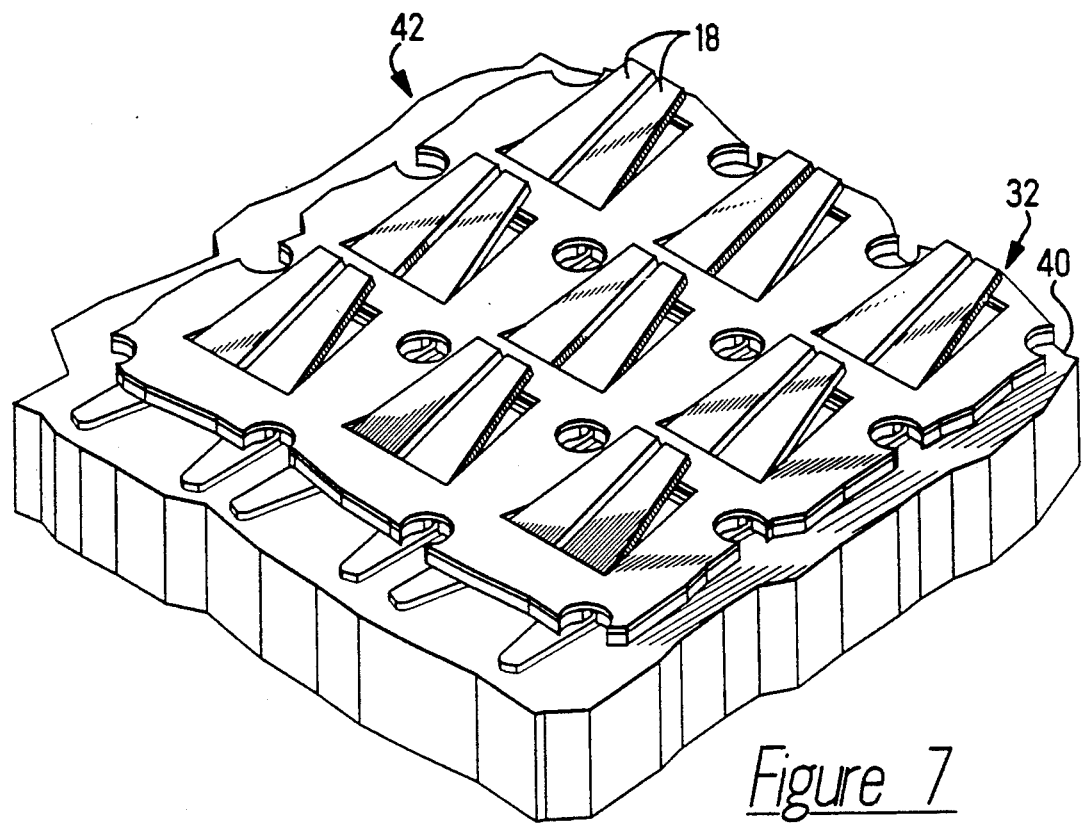
FIG. 7 is a view of the contact laminate soldered to the board to form an assembly.

FIG. 6 shows the next step which includes depositing solder paste 38 on circuit board 40 in an array which corresponds to the array defined by contact element plates 20 and legs 22 on contact laminate 32. Laminate 32 is then positioned on board 40 in registration with the array of solder paste 38 and, upon fusing the solder paste 38 to permanently secure the two together, area array connector 42 shown in FIG. 7 is formed. By selectively locating solder paste 38 on board 40, only selected parts of elements 10 are solder thereto.

Figure 8:
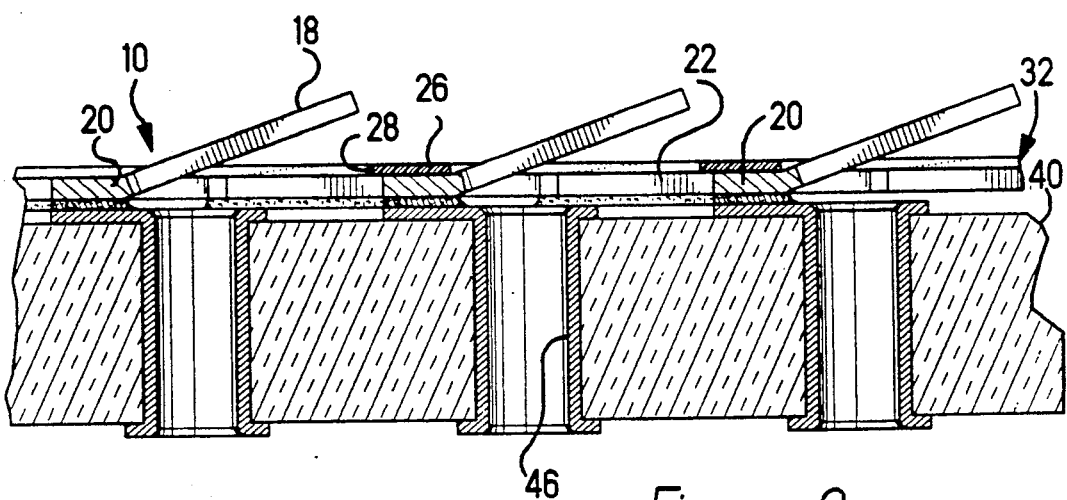
FIG. 8 is a side sectional view of the assembly.
Figure 9:
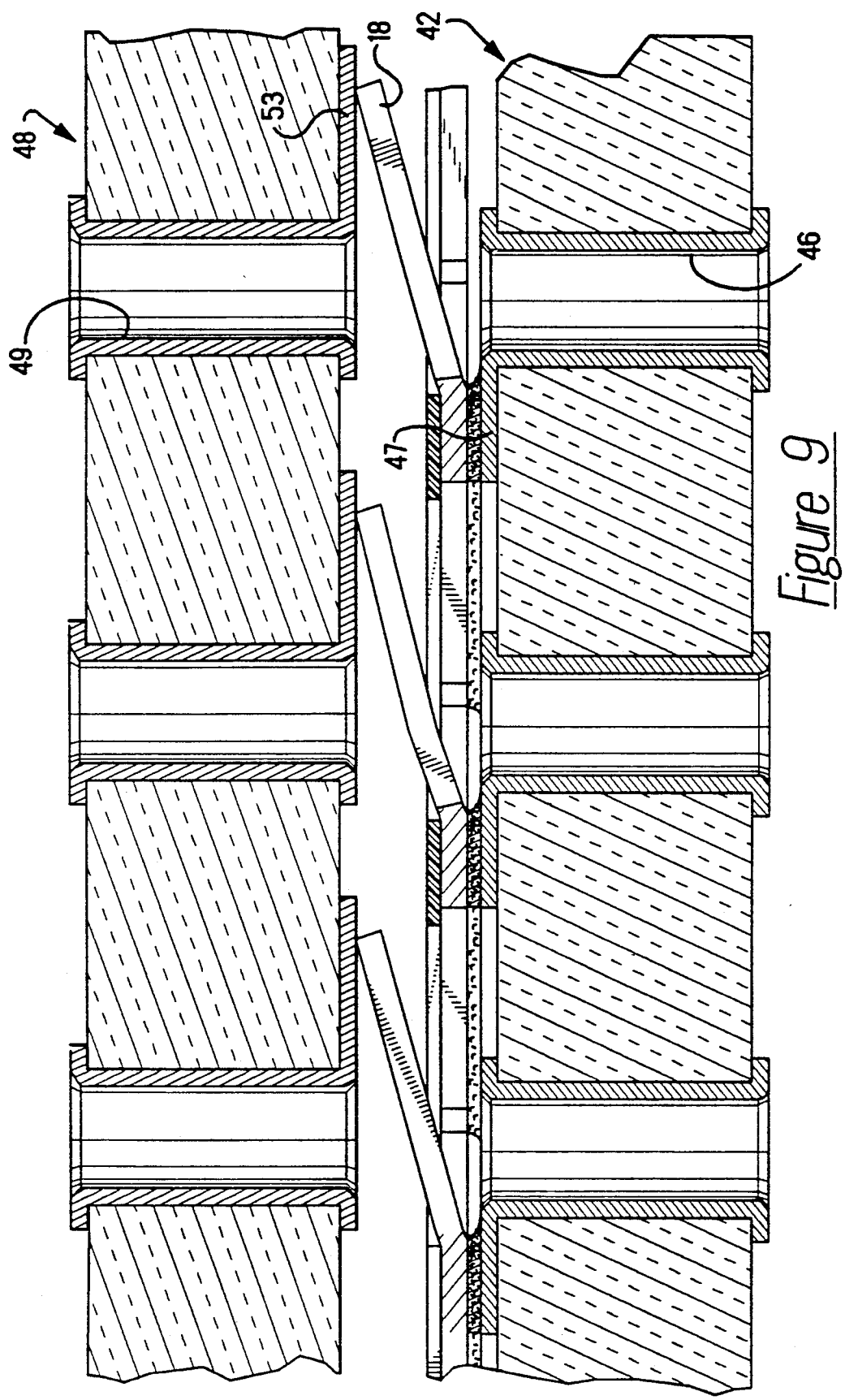
FIG. 9 is a side sectional view of a module positioned on the assembly.

As shown in FIG. 8 area array connector 42 includes plated vias 46 in board 40 with contact pads 47 and with plates 20 and legs 22 of contact elements 10 soldered two such pads to form the connector 42 thereto. Contact fingers 18 extend up through windows 28 for electrically engaging an electronic device or, as shown in FIG. 9, circuit board 48 having via 49 with contacts pads 53.

Figure 11:
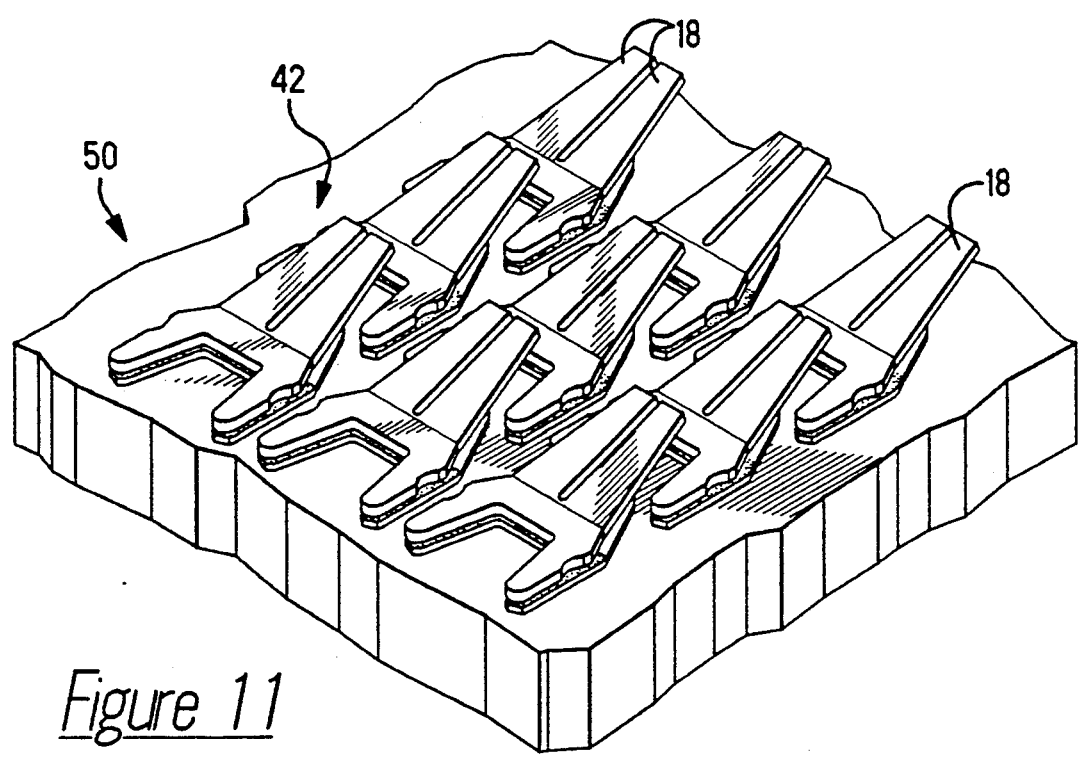
FIG. 11 is a view of the alternative embodiment of FIG. 10 with the temporary structural members removed.

If contact laminate 32 is formed using a solvent soluble adhesive, film 26 can be removed by placing connector 42 in a suitable solvent such as alcohol after soldering the contact elements to board 40. FIG. 10 shows an area array connector 50 with film 26 removed. In the drawing, the temporary structural members 52 are shown simply to illustrate the results of the perforating step discussed above with respect to FIG. 7. As members 52 are unattached, they are easily disposed of leaving connector 50 as shown in FIG. 11.

Contact elements 10 are preferably electroplated by one or more metals selectively to provide the best interface for soldering where required and for the best metallurgy on contact fingers 18. Alternatively, the elements 10 may be plated uniformly. Further a raised surface (not shown) adjacent free ends of fingers 18, either of gold or other noble metals or plated with such, may be provided.

Area array connectors 42 and 50 have been illustrated as including circuit board 40. However, contact laminate 32 can be mounted on other devices (not shown) or even used alone as an interconnect connector as noted above. Further, although soldering laminate 32 is shown, other conventional methods of securing can be used.

Contact elements 10 have been illustrated as including plate 20 and legs 22. These structural features can be modified to meet particular array patterns. Further, a single contact finger 18 could be employed.

An alternative embodiment (not shown) is one having the two contact fingers 18 but with one bent up (as shown) and the other bent down to engage a circuit area on an underlying electronic device or substrate.

Of the several advantages of the present invention, a most important one is that contact elements 10 can be made very small and automatically. Similarly the forming of contact laminate 32 and isolating elements 10 is substantially machine done. Laminates 32 on continuous rolls can be furnished to work stations where connectors 42 can be formed, again substantially operator free. Connectors 42 can be made in any size for any desired application.

As can be discerned, an area array connector has been disclosed for use in providing a separable interconnection between electronic devices. The connector includes a plurality of contact elements having cantilever spring contact fingers extending obliquely outwardly and a plate and legs for being secured to a substrate or other electronic device. One method of forming a connector has been disclosed which includes making a contact laminate by securing a sheet of cut out contact elements to a film or like material and then separating the contact elements from each other. The contact laminate can now function as a connector or can be secured to a device such as a circuit board. When used as a connector, the laminate will have flexibility and can be used on uneven surfaces.

I claim:

1. An electrical area array connector for use in interconnecting first and second electronic devices, each having an array of contact pads disposed on a planar surface thereof, an array of contact elements each including a plate portion electrically and mechanically attached to the contact pad of the second device and at least one contact spring finger extending freely and obliquely relative to the plane of the plate portion an second element to resiliently engage the contact pad of the first device and provide an interconnection of the contact pads of the first and second devices.

2. The connector of claim 1 wherein the said contact elements each include a pair of contacts springs.

3. The connector of claim 1 wherein the said plate portion is soldered to the contact pad of the second device to effect the electrical and mechanical connection therewith.

4. The connector of claim 1 further including a plastic sheet having holes therein on centers compatible with the array of pads of the firs and second devices with the holes having a geometry to receive the contact finger inserted therethrough and with the contacts attached to said sheet to facilitate mounting of the contacts on the second device.

5. An electrical area array connector for use in interconnecting electronic devices, comprising a plurality of contact elements having a cantilevered contact finger extending obliquely outwardly from one side of a plate wherein each contact element includes a pair of parallel cantilevered contact fingers.

6. An electrical area array connector for use in interconnecting electronic devices, comprising a plurality of contact elements having a cantilevered contact finger extending obliquely outwardly from one side of a plate wherein each contact element includes a pair of legs extending outwardly from an opposite side of said plate.

7. A connector of a type adapted to interconnect electrical devices each having planar surfaces with contact pads thereon arranged in an array on given centers including an array of contacts, one for each contact pad of one of the devices, each contact having a flat plate portion electrically and mechanically attached to each pad of the one device with a contact spring finger extending from the plate portion at an angle to the surface of one of the devices adapted to be deflected by the devices being driven relatively together to interconnect the pads of the one device to the pads of the other device.

8. The connector of claim 7 wherein the contact includes a pair of spring fingers with the ends thereof effecting such interconnection between pads.

9. The connector of claim 7 wherein the said plate portions are soldered to the pads of the one device.

10. The connector of claim 7 wherein there is included a plastic sheet with the said contacts laminated thereto on a given centers prior to soldering of the plate to the pads.

* * * * *

UNITED STATES PATENT AND TRADEMARK OFFICE
CERTIFICATE OF CORRECTION

PATENT NO. : 5,173,055
DATED : December 22, 1992
INVENTOR(S) : Dimitry G. Grabbe It is certified that error appears in the above-identified patent and that said Letters Patent is hereby corrected as shown below:

In the Claims:

Claim 1, Column 4, Line 2 - replace the word "an" with the word -- and --.

Claim 4, Column 4, Line 14 - replace the word "firs" with the word -- first --.

Claim 10, Column 4, Line 50 - replace the word "a" with the word -- the --.

Signed and Sealed this

Twenty-sixth Day of October, 1993

Attest:

BRUCE LEHMAN

Attesting Officer          Commissioner of Patents and Trademarks